United States Patent [19]
Mohwinkel

[11] Patent Number: 5,099,155
[45] Date of Patent: Mar. 24, 1992

[54] ACTIVE ELEMENT FILTER NETWORK

[75] Inventor: Clifford A. Mohwinkel, San Jose, Calif.

[73] Assignee: Pacific Monolithics, Sunnyvale, Calif.

[21] Appl. No.: 690,162

[22] Filed: Apr. 22, 1991

[51] Int. Cl.[5] .......................... H03B 1/00; H03F 3/16
[52] U.S. Cl. .................................. 307/520; 328/167; 307/304
[58] Field of Search ............... 307/520, 521, 572, 304; 328/167; 330/277; 333/167, 173

[56] References Cited

U.S. PATENT DOCUMENTS

| | | | |
|---|---|---|---|
| 3,586,887 | 6/1971 | Ziel et al. ............... | 307/520 |
| 5,038,060 | 8/1991 | Franchetesa et al. ...... | 307/520 |

FOREIGN PATENT DOCUMENTS 0106150  8/1979  Japan .................. 307/520

OTHER PUBLICATIONS

Adams et al., "Active Filters for UHF and Microwave Frequencies", 9/69, *IEEE Transactions on Microwave Theory and Techniques*, vol. MTT-17, No. 9, pp. 662-670.

Hara et al., "Broad Band Monolithic Microwave Active Inductor and Application to a Miniaturized Wide Band Amplifier", *IEEE 1988 Microwave and Millimeter-Wave Monolithic Circuits Symposium*, pp. 117-120.

Sackinger et al., "A High-Swing, High-Impedance MOS Cascode Circuit", *IEEE Journal of Solid-State Circuits*, vol. 25, No. 1, Feb. 1990, pp. 289-297.

*Primary Examiner*—Timothy P. Callahan
*Attorney, Agent, or Firm*—Edward B. Anderson

[57] ABSTRACT

A simple cascode configuration of a first, common source transistor coupled to a second, "common" gate transistor is modified by the use of a third transistor conditionally coupling the "common" gate to the source of the second transistor. This coupling is made conditional by a filter network connecting the "common" gate to the source of the second transistor and to the drain of the regulating or third transistor. High pass, low pass and band pass RC network configurations are shown.

12 Claims, 3 Drawing Sheets

ACTIVE ELEMENT FILTER NETWORK

FIELD OF THE INVENTION

This invention relates to active filters, and particularly to such filters having a filter network between active elements.

BACKGROUND OF THE INVENTION

Integrated circuits are well-known for the limited amount of circuit area that they require. This is particularly true of filters made of integrated circuits. However, active filters conventionally require the use of a negative resistance (−R) component that inherently makes them somewhat temperature sensitive and unstable. This −R component is generally used to produce inductance terms in the transfer function. Further, inductor coils use significantly more circuit area than do resistors or capacitors. It is therefore desirable to have an active filter that does not require the use of inductor coils.

The use of active elements in filters has been known for many years. For instance, Adams et al. in "Active Filters for UHF and Microwave Frequencies", *IEEE Transactions on Microwave Theory and Techniques*, Vol. MTT-17, No. 9, Sept. 1969, pages 662-670 describes some basic single-transistor designs using inductors. Hara et al. in "Broad Band Monolithic Microwave Active Inductor and Application to a Miniaturized Wide Band Amplifier", *IEEE* 1988 *Microwave and Millimeter-Wave Monolithic Circuits Symposium*, pages 117-120 disclose the use of a cascode transistor circuit configured to function as an active inductor. However, an active matching amplifier they describe that uses the active inductor also uses inductor coils, based on the negative resistance principle.

It has been found that a cascode circuit can be configured to function as a "super transistor". A cascode circuit typically includes a first input transistor, such as a FET having a common source, coupled in series with a second output transistor, such as a FET having a common gate. In "A High-Swing, High-Impedance MOS Cascode Circuit", *IEEE Journal of Solid-State Circuits*, Vol. 25, No. 1, Feb. 1990, pages 289-297, Sackinger et al. describe connecting a third, regulating transistor between the gate and source of the second transistor and ground. The authors refer to this configuration as a regulated cascode circuit. The output impedance of this circuit is higher and the usable output-voltage range is enlarged compared to those of a simple cascode circuit. This circuit has a fixed configuration and so does not accommodate various filtering requirements.

An active filter that does not require, but allows the use of inductors and which is usable in a radio-frequency signal path is therefore desirable.

SUMMARY OF THE INVENTION

The present invention provides an active filter having significant roll-off between band-pass and band-reject regions. In particular, a portion of the "regulated cascode circuit" of Sackinger et al. is modified to provide active filtering.

In its general form, an active filter made according to the invention includes a filter network connecting the gate of an output transistor to the source of the same transistor and to the drain of a common-source transistor. The general function of the network is to maintain coupling between the gate of the output transistor and the drain of the common-source transistor during the pass band, and to transfer coupling of the gate of the output transistor from the drain of the common-source transistor to the source of the output transistor during the rejection band.

In a low-pass network configuration, the coupling between the source and gate of the output transistor is capacitive, while the coupling between the gate of the output transistor and the common-source transistor is resistive. In a high-pass configuration, the reverse is true. In a band-pass configuration, a combination of these impedances is used.

In the preferred embodiments this filter is used with an input common-source transistor, which results in a modification of the "regulated cascode configuration". The filter may also use a series of basic filter configurations. Other configurations are also useful.

These filters are thus realized without the use of inductor coils, although inductors may also be included in the filter network. These filters are therefore less temperature sensitive and more stable, since they do not necessarily use negative resistance. They have a high output impedance and a relatively wide signal voltage swing. The basic circuits have faster roll off than simple RC filter networks or the basic regulated cascode circuit.

These and other features and advantages of the present invention will be apparent from the following detailed description of the preferred embodiments and associated drawings.

DETAILED DESCRIPTION OF THE PREFERRED EMBODIMENT

Figure 1:
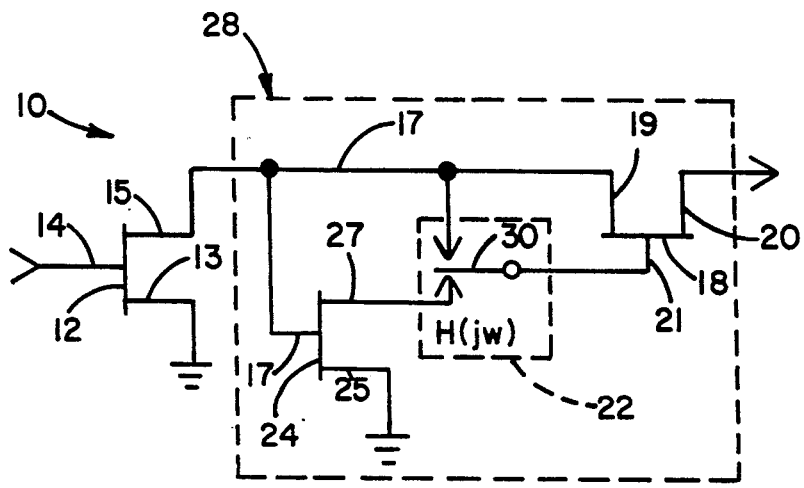
FIG. 1 is a preferred active filter made according to the present invention.

Referring initially to FIG. 1, an active filter 10 made according to the invention is shown. A composite filter 10 includes active elements, that in the preferred embodiments are FETs. They could also be bipolar transistors or even vacuum tubes. They include an optional input or third transistor 12 having a source 13 coupled to a reference voltage, such as ground, and a gate 14 for receiving an input RF signal. The drain 15 of transistor 12 is coupled via a junction 17 to a second transistor 18 via a source 19. A drain 20 of transistor 18 outputs the filtered signal, and a gate 21 is coupled to a filter network 22.

A regulating or first transistor 24 has a source 25 coupled to ground, a gate 26 coupled to junction 17, and a drain 27 coupled to network 22. The network is also coupled to junction 17.

Transistors 18 and 24 and network 22 comprise a basic filter circuit 28. Conductor 17 serves as the input to circuit 28. Transistor 12, as part of composite filter 10, functions as a signal source for filter circuit 28.

The filter network is represented generally by a transfer function $H(j\omega)$ that provides a switching function, represented symbolically by a switch 30. In the pass band of signal frequencies, network 22 connects gate 21 to drain 27 and disconnects gate 21 from source 19. In the stop or rejection band, the network connects gate 21 to source 19 and disconnects it from drain 27. In this latter situation, no signal can get from the input to the output since transistor 18 is operating as a current source and therefor is open circuiting the signal from the drain of transistor 12 to the load.

Figure 2:
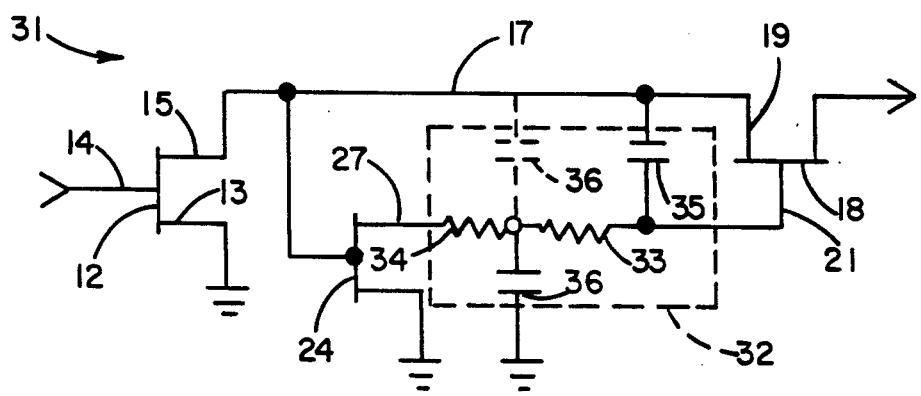
FIG. 2 is a basic low-pass embodiment of the filter of FIG. 1.
Figure 3:
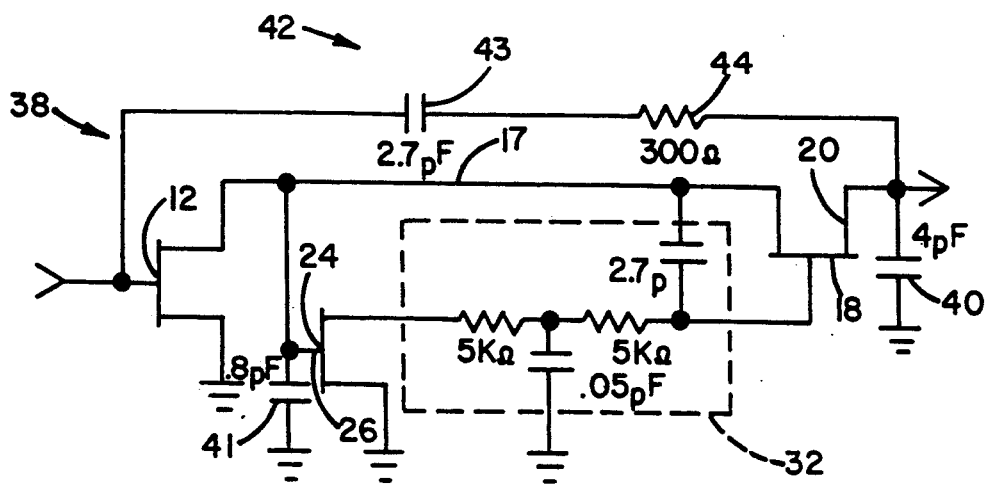
FIG. 3 is a preferred embodiment of the filter of FIG. 2.

FIGS. 2 and 3 show different versions of an active filter providing low-pass filtering. A basic low-pass filter 31 having a filter network 32 is shown in FIG. 2. It includes resistors 33 and 34 coupled in series between gate 21 and drain 27 and a capacitor 35 coupling gate 21 to source 19. A second capacitor 36 couples the node between the series resistors to ground. As noted in phantom lines, capacitor 36 may be coupled to junction 17 instead, without altering the filter performance.

It will be seen that at low frequencies, the impedance from capacitor 35 is high, resulting in the primary connection of gate 21 being through the series resistors to transistor 24. At high frequencies, capacitor 35 acts like a short, making it the primary conductance path for gate 21. This circuit shows more than 12 dB per octave roll off.

FIG. 3 is an illustration of an active filter 38 with network 32 of FIG. 2, but also with additional poles, giving it even greater roll off between the pass band and the stop band. These additional poles are provided by a shunt capacitor 40 on the output coupling drain 20 to ground. Another shunt capacitor 41 couples gate 26 of transistor 24, which is the same as junction 17, to ground. An impedance matching feedback circuit 42 connecting the filter output and input comprises the series connection of a capacitor 43 and a resistor 44.

Figure 4:
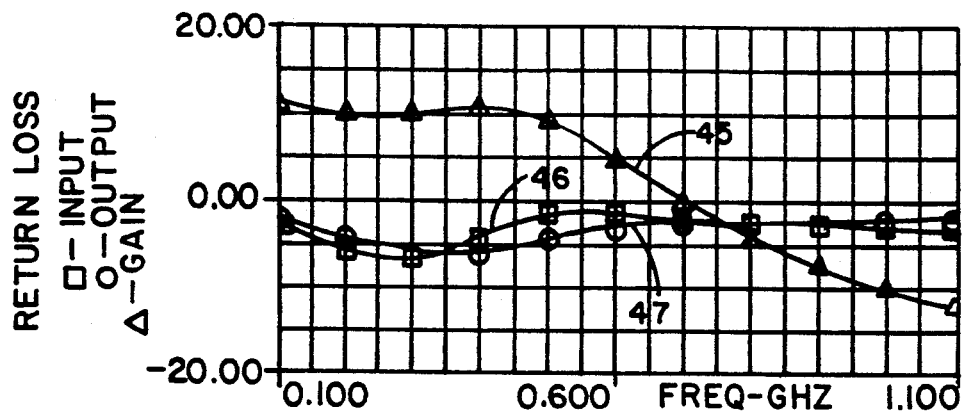
FIG. 4 is a graph showing simulated operation of the filter of FIG. 3.

FIG. 4 shows the simulation results of the operation of filter 38. The gain is shown as curve 45, the input return loss (VSWR) as curve 46, and the output return loss as curve 47. The gain remains relatively constant throughout the band pass shown of about 100 kHz to 500 kHz. Above 500 kHz the gain rolls off at about 20 dB per octave. The return loss figures show that the circuit is not well matched. This is accommodated by the adjoining circuits.

Figure 5:
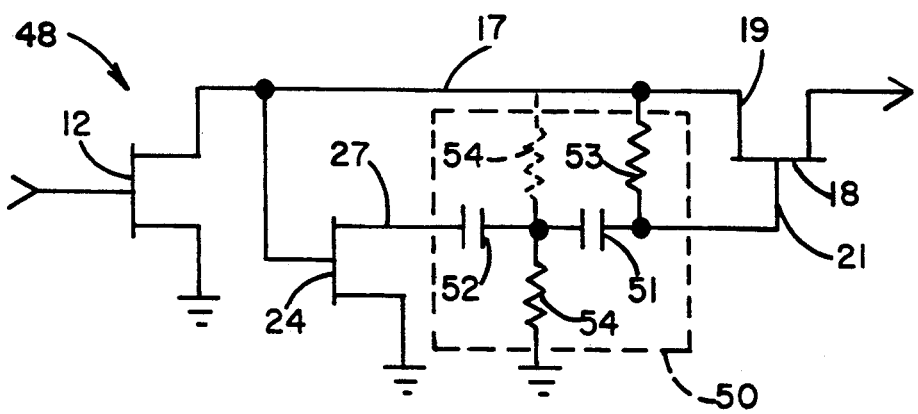
FIG. 5 is a basic high-pass embodiment of the filter of FIG. 1.

FIG. 5 shows a filter 48 having a network 50 that causes the filter to have a high-frequency pass band. In network 50 the locations of resistors and capacitors are just the reverse of the locations of resistors and capacitors in the filter of FIG. 2. Network 50 includes series capacitors 51 and 52 coupling gate 21 to drain 27. A resistor 53 couples gate 21 to source 19, and a shunt resistor 54 couples the node between the series capacitors to ground. Again, as was the case with capacitor 36 in network 32, resistor 54 may alternatively be coupled to junction 17, as is shown in phantom lines.

Figure 6:
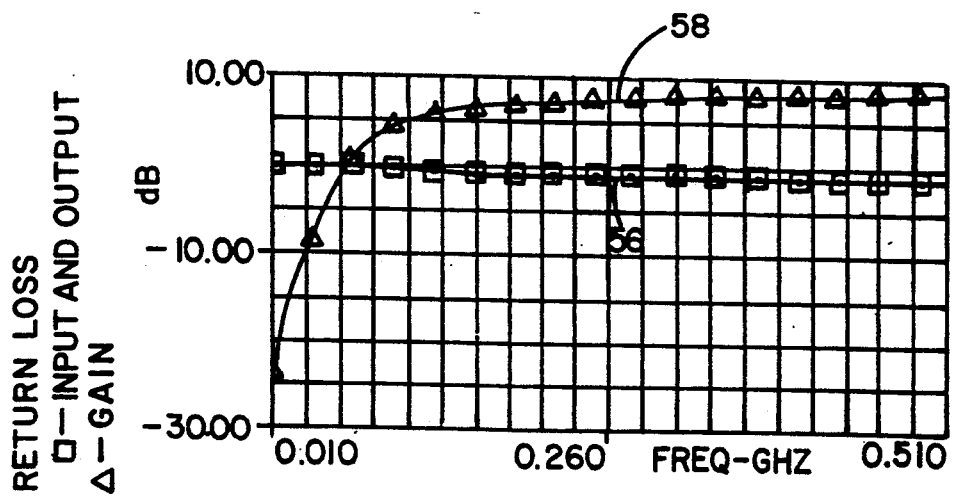
FIG. 6 is a graph showing simulated operation of the filter of FIG. 5.

The performance of filter 48 is illustrated in FIG. 6. The input and output return losses are substantially coincident, as shown by curve 56, is substantially constant at just under 0 dB. The gain is shown as curve 58. The roll off below about 85 kHz is about 12 dB per octave.

Figure 7:
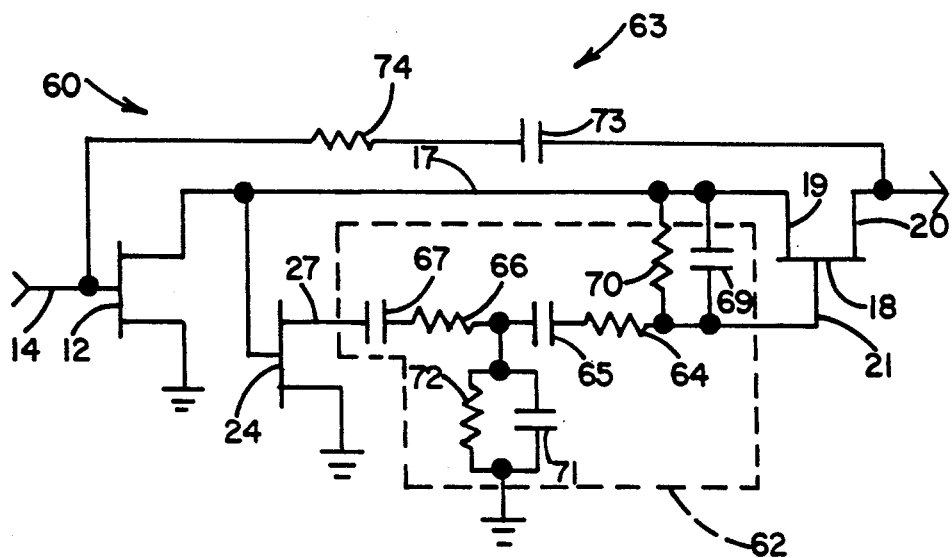
FIG. 7 is a band-pass embodiment of the filter of FIG. 1.

Another embodiment of the invention is shown in FIG. 7 as active filter 60. This filter includes a network 62 and a feedback circuit 63 that results in a band pass configuration. The gate of second transistor 18 is coupled to the drain of third transistor 24 via the series connection of resistor 64, capacitor 65, resistor 66 and capacitor 67. Gate 21 is also coupled to source 19 via the parallel combination of a capacitor 69 and resistor 70. The node between capacitor 65 and resistor 66 is coupled to ground via the parallel combination of capacitor 71 and resistor 72.

Feedback circuit 63 includes the series connection of a capacitor 73 and a resistor 74 connecting the filter output and input to improve the output impedance match.

Figure 8:
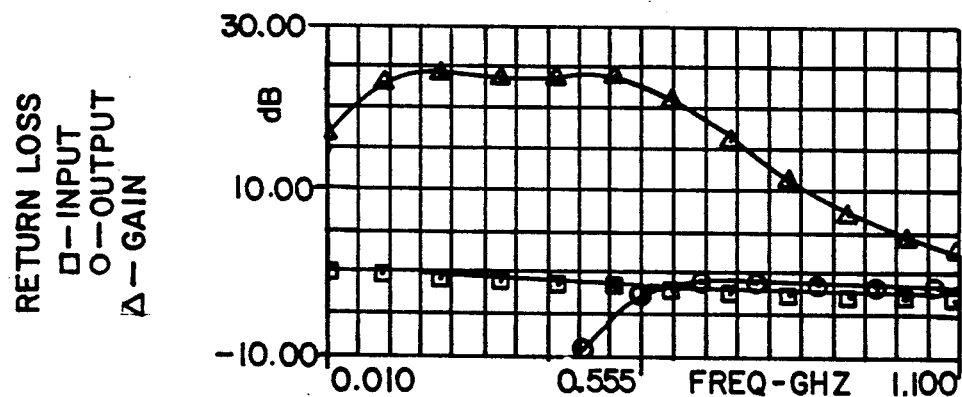
FIG. 8 is a graph showing simulated operation of the filter of FIG. 7.

The various combinations of resistors and capacitors are picked to provide an intermediate pass band, as desired, and corresponding high and low stop bands. FIG. 8 illustrates the performance of filter 60 for one particular set of values for the network and feedback circuit components. As shown by the gain curve 76, the pass band extends from about 100 kHz to 600 kHz. The input return loss, shown as curve 77, and output return loss, shown as curve 78, are just below 0 dB for the frequency spectrum shown.

Figure 9:
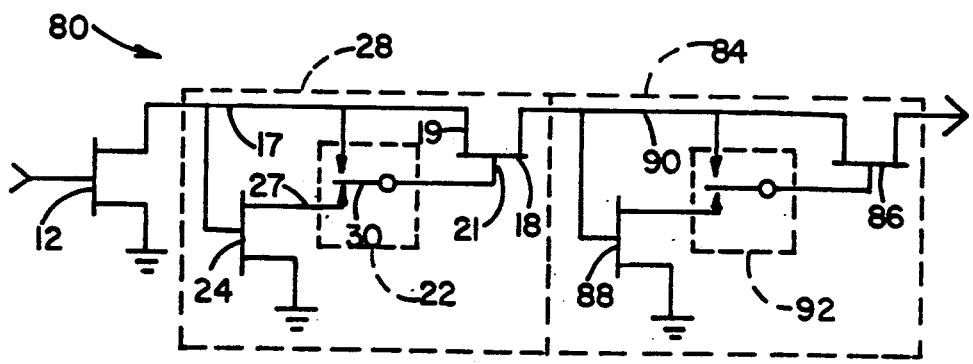
FIG. 9 is another embodiment, based on the filter of FIG. 1, of an active filter made according to the invention.

Because of the inherent stability and temperature insensitivity of the filter of FIG. 1, the basic filter circuit of FIG. 1 can be repeated in the same filter to improve the overall operation of the filter. Such a filter is shown generally at 80 in FIG. 9. Components that are the same as the components in FIG. 1 are shown with the same reference numbers. Thus, filter 80 may include a common source input FET 12 the gate of which receives a signal to be filtered.

The drain of FET 12 is coupled to what is now referred to as a first filter module 28 coupled in series with a second filter module 84. Additional such modules may be added on. Module 28 includes the remaining components as shown in the filter of FIG. 1. Thus, it includes transistors 18 and 24 connected together by conductor 17 and filter network 22, as was described with reference to FIG. 1.

Module 84, in its generic form, as is illustrated in the figure, is a duplicate of module 28. Although in general characteristics the two (or more) modules are duplicated, the specific embodiments of the modules may take on any of the forms generally described with reference to FIGS. 2, 3, 5 and 7, or other variations not illustrated.

Module 84, then as representative of the additional modules, has fourth and fifth FETs 86 and 88, respectively (also referred to as third and fourth FETs when transistor 12 is not included) connected to the drain of the second FET 18 of the first or prior module, like the connection of FETs 18 and 24 of module 28 to the drain of FET 12. The fourth and fifth FETs are connected together by a conductor 90 and a filter network 92. The filter network has the same general operational characteristics as filter network 22, described with reference to FIG. 1.

The applications that this configuration are useful in are numerous. In describing this generally, module 82 may be considered to have a first frequency range that represents a reject band and a second frequency range that represents a pass band. Correspondingly, module 84 may be considered to have a third frequency range that represents a reject band and a fourth frequency range that represents a pass band.

Thus, a low-pass filter or a high-pass filter would result if the first and third frequency ranges are the same and the second and fourth frequency ranges are the same. This would result if modules 28 and 84 are made to be identical, such as is illustrated by the embodiments shown in FIGS. 2 and 5. The pass band in such a filter is more sharply defined due to steeper roll off.

A band-pass filter is also formed by making one of the modules to provide low-pass filtering and making the other of the modules to provide high-pass filtering, with an overlapping pass band. In such a case, the first and third frequency ranges are different, and there is overlap in the second and fourth frequency ranges. The resultant pass band is then defined by the extent of overlap in the respective pass bands of the modules. Similarly, a band reject filter could be produced.

Increased numbers of modules are useful for creating filters having other characteristics using the same concepts. For instance, a series of reject networks could also be used to produce a reject-band filter.

The present invention thus provides an active filter that does not require the use of coils, is effective primarily below 5 GHz, and can be configured as low pass, high pass and band pass filters. Although coils (inductors) may be used, when using only resistors and capacitors to form the filter network, the filter is readily constructed with integrated circuit techniques. Low values of capacitors are used, making it readily fabricated in integrated circuits. By cascading the filter sections, improved performance is achieved with little increase in temperature sensitivity or instability.

It will be apparent to one skilled in the art that other variations in form and detail may be made in the preferred embodiment without varying from the spirit and scope of the invention as defined in the claims. The preferred embodiments are thus provided for purposes of explanation and illustration, but not limitation.

I claim:

1. An active filter comprising:
   at least two transistor means with each transistor means having a control terminal and two current-conducting terminals, a first one of the transistor means having the control terminal for receiving a signal to be filtered and a first current-carrying conductor coupled to a reference potential; a second one of the transistor means having a first current-carrying terminal also for receiving the signal to be filtered and a second current-carrying terminal for outputting the filtered signal; and
   first filter network means coupled between the second current-carrying terminal of the first transistor means and both the control terminal and the first current-carrying terminal of the second transistor means, which filter network means provides, for a first frequency range, a relatively high impedance between the control terminal of the second transistor means and the second current-carrying terminal of the first transistor means and a relatively low impedance between the control terminal and the first current-carrying terminal of the second transistor means for suppressing the input signal over the first frequency range.

2. A filter according to claim 1 wherein the filter network means provides, over a second frequency range different than the first frequency range, a relatively low impedance between the control terminal of the second transistor means and the second current-carrying terminal of the first transistor means and a relatively high impedance between the control terminal and the first current-carrying terminal of the second transistor means for transmitting the input signal over the second frequency range.

3. A filter according to claim 2 wherein the filter means comprises capacitance means coupling the control terminal and the first current-carrying terminal of the second transistor means, and resistance means coupling the control terminal of the second transistor means to the second current-carrying terminal of the first transistor means, whereby the first frequency range is higher than the second frequency range.

4. A filter according to claim 3 wherein the filter means further comprises additional capacitance means, in series with the resistance means, coupling the control terminal of the second transistor means to a reference potential.

5. A filter according to claim 2 wherein the filter means comprises first resistance means coupling the control terminal and the first current-carrying terminal of the second transistor means, and first capacitance means coupling the control terminal of the second transistor means to the second current-carrying terminal of the first transistor means, whereby the first frequency range is lower than the second frequency range.

6. A filter according to claim 5 wherein the filter means further comprises second capacitance means in parallel with the first resistance means, and second resistance means in parallel with the first capacitance means, whereby there exists a third frequency range higher than the first frequency range over which the input signal is suppressed.

7. A filter according to claim 5 further comprising second resistance means, in series with the first capacitance means, coupling the control terminal of the second transistor means to a reference potential.

8. A filter according to claim 1 further comprising:
   a third transistor means having a first current-carrying terminal coupled to the second current-carrying terminal of the second transistor means;
   a fourth transistor means having a first one of the current-carrying terminals coupled to the reference potential and the control terminal coupled to the first current-carrying terminal of the third transistor means; and
   second filter network means coupled between the second current-carrying terminal of the fourth transistor means and both the control terminal and the first current-carrying terminal of the third transistor means, which second filter means provides, for a third frequency range, a relatively high impedance between the control terminal of the third transistor means and the second current-carrying terminal of the fourth transistor means and a relatively low impedance between the control terminal and the first current-conducting terminal of the third transistor means for suppressing the input signal over the third frequency range.

9. A filter according to claim 8 wherein the second filter network means provides, over a fourth frequency range different than the third frequency range, a relatively low impedance between the control terminal of the third transistor means and the second current-carrying terminal of the fourth transistor means and a relatively high impedance between the control terminal and the first current-carrying terminal of the third transistor means for transmitting the input signal over the fourth frequency range.

10. A filter according to claim 9 wherein the second and fourth frequency ranges are substantially the same.

11. A filter according to claim 10 wherein the first and third frequency ranges are substantially the same.

12. A filter according to claim 1 further comprising an input transistor means having an input control terminal for receiving the signal to be filtered, a first current-carrying terminal coupled to the reference potential, and a second current-carrying terminal coupled both to the control terminal of the first transistor means and to the first current-carrying terminal of the second transistor means for generating a current in the current-carrying terminals of the input transistor means representative of the voltage of the signal received on the input control terminal.

* * * * *